(12) United States Patent
Liu et al.

(10) Patent No.: US 8,183,064 B2
(45) Date of Patent: May 22, 2012

(54) THIN FILM TRANSISTOR DEVICES FOR OLED DISPLAYS AND METHOD FOR FABRICATING THE SAME

(75) Inventors: Yu-Chung Liu, Kaohsiung (TW); Te-Yu Lee, Jhubei (TW); Te-Chang Wan, Taipei (TW); Kuo-Chao Chen, Sinwu Township (TW); Mei-Ling Chang, Gongguan Township (TW)

(73) Assignee: Chimei Innolux Corporation, Chu-Nan (TW)

( * ) Notice: Subject to any disclaimer, the term of this patent is extended or adjusted under 35 U.S.C. 154(b) by 242 days.

(21) Appl. No.: 12/715,316

(22) Filed: Mar. 1, 2010

(65) Prior Publication Data

US 2010/0271349 A1    Oct. 28, 2010

(30) Foreign Application Priority Data

Mar. 2, 2009   (TW) ................................ 98106640 A

(51) Int. Cl.
| | |
|---|---|
| H01L 21/00 | (2006.01) |
| H01L 29/04 | (2006.01) |
| H01L 31/036 | (2006.01) |
| G09G 5/00 | (2006.01) |

(52) U.S. Cl. ..................... 438/22; 257/72; 257/E33.003; 345/205

(58) Field of Classification Search .................... 438/22; 257/72, E33.003; 345/205
See application file for complete search history.

(56) References Cited

U.S. PATENT DOCUMENTS

| | | | |
|---|---|---|---|
| 2007/0001225 A1* | 1/2007 | Ohnuma et al. | 257/347 |
| 2011/0165741 A1* | 7/2011 | Yamazaki et al. | 438/158 |
| 2011/0256702 A1* | 10/2011 | Fujii | 438/586 |

OTHER PUBLICATIONS

Tsai et al., "Fabrication of Excimer Laser Crystallized Double-Gate Low-Temperature Poly-Silicon Thin Film Transistors", published on the 14th International Workshop on Active-Matrix Flat Panel Displays & Devices (AM-FPD '07, former AM-LCD), Jul. 11, 2007, pp. 37-40.

* cited by examiner

*Primary Examiner* — David S Blum
(74) *Attorney, Agent, or Firm* — Liu & Liu

(57) ABSTRACT

A system for displaying images. The system includes a thin film transistor (TFT) device including a first gate layer disposed on a first region of a substrate and covered by a first insulating layer. A first polysilicon active layer is disposed on the first insulating layer and a second polysilicon layer is disposed on a second region of the substrate. A second insulating layer covers both of the first and second polysilicon gate layers. Second and third gate layers are respectively disposed on the second insulating layer above the first and second polysilicon active layers. A method for fabricating a system for displaying images including the TFT device is also disclosed.

20 Claims, 21 Drawing Sheets

US 8,183,064 B2

THIN FILM TRANSISTOR DEVICES FOR OLED DISPLAYS AND METHOD FOR FABRICATING THE SAME

This Application claims priority of Taiwan Patent Application No. 098106640, filed on Mar. 2, 2009, the entirety of which is incorporated by reference herein.

BACKGROUND OF THE INVENTION

1. Field of the Invention

The invention relates to flat panel display technology, and in particular to an organic light-emitting diode (OLED) display comprising a thin film transistor (TFT) device having a dual-gate structure in an OLED driving region and a method for fabricating the same.

2. Description of the Related Art

The demand for active-matrix flat panel displays, such as active matrix organic light emitting device (AMOLED) displays, has increased rapidly in recent years. AMOLED displays typically employ thin film transistors (TFTs) as a switching element and as a driving element for a light-emitting device in a pixel region. Additionally, AMOLED displays also employ a complementary metal oxide semiconductor (CMOS) circuit composed of TFTs in a peripheral circuit region.

Such elements are classified as amorphous silicon (a-Si) TFTs and polysilicon TFTs according to the active layer materials used. Compared with a-Si TFTs, polysilicon TFTs have the advantages of high carrier mobility, high driving-circuit integration and low leakage current, and are often applied to applications that require high-speed operation. Thus, low temperature polysilicon (LTPS) is a novel application of the FPD technology. LTPS allows for an easier IC manufacturing process, which integrates driving circuits on a substrate having pixels thereon, reducing manufacturing costs.

For LTPS TFT fabrication, the TFTs in the peripheral circuit region and the pixel region have substantially the same electrical characteristics. In AMOLED displays, however, the electrical characteristics of the TFTs in the peripheral circuit region and the switching TFTs in the pixel region are different from the driving TFTs in the pixel region. For example, it is desirable to design the former with high carrier mobility and low sub-threshold swing, thereby providing a faster response. Additionally, it is desirable to design the latter with high sub-threshold swing and low threshold voltage to increase gray scale and extend OLED lifespan. However, it is difficult to fabricate TFTs with different electrical characteristics with the LTPS fabrication process.

Therefore, there exists a need in the art for development of an improved TFT device for OLED displays, having different electrical characteristics and capable of eliminating mura defects induced by driving TFTs of OLEDs.

BRIEF SUMMARY OF THE INVENTION

A detailed description is given in the following embodiments with reference to the accompanying drawings. A system for displaying images and a method for fabricating the same are provided. An exemplary embodiment of a system for displaying images comprises a thin film transistor (TFT) device comprising a substrate having a first region and a second region. A first gate layer is disposed on the first region of the substrate. A first insulating layer covers the first gate layer. A first polysilicon active layer is disposed on the first insulating layer. A second polysilicon active layer is disposed on the second region of the substrate. A second insulating layer covers the first and second polysilicon active layers. A second gate layer is disposed on the second insulating layer above the first polysilicon active layer. A third gate layer is disposed on the second insulating layer above the second polysilicon active layer. A first thin film transistor is constituted by the first polysilicon active layer, the first and second gate layers, and the first and second insulating layers in the first region. A second thin film transistor is constituted by the second polysilicon active layer, the third gate layer, and the first and second insulating layers in the second region.

An embodiment of a method for fabricating a system for displaying images, wherein the system comprises a thin film transistor device, comprising providing a substrate having a first region and a second region. A first gate layer is formed on the first region of the substrate. The first gate layer is covered with a first insulating layer. A first polysilicon active layer is formed on the first insulating layer by a first crystallization process. A second polysilicon active layer is formed on the second region of the substrate by a second crystallization process, such that the second polysilicon active layer has a grain size greater than that of the first polysilicon active layer. The first and second polysilicon active layers are covered with a second insulating layer. A second gate layer is formed on the second insulating layer above the first polysilicon active layer and a third gate layer is simultaneously formed on the second insulating layer above the second polysilicon active layer.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is provided for the purpose of illustrating the general principles of the invention and should not be taken in a limiting sense. The scope of the invention is best determined by reference to the appended claims.

Figure 1:
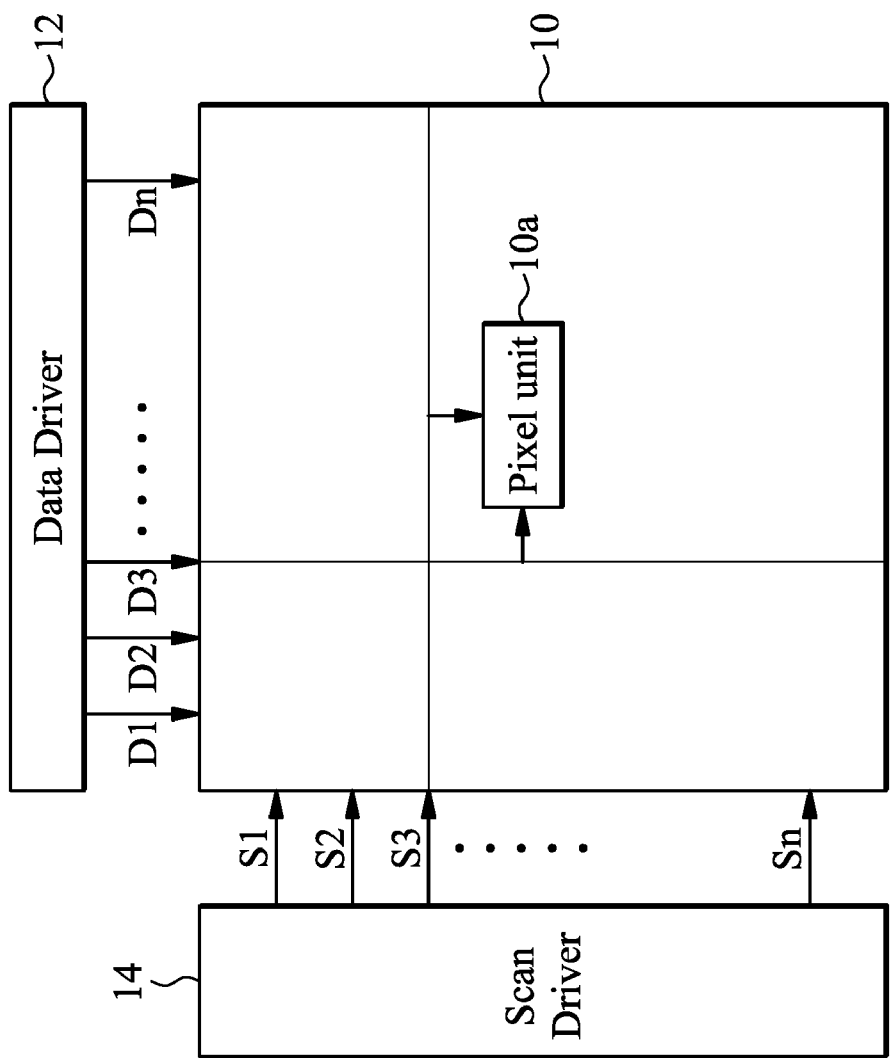
FIG. 1 is a plan view of an active matrix organic light emitting device display.

Referring to FIG. 1, which is a plan view of an active matrix organic light emitting device (AMOLED) display. The AMOLED display comprises a display panel 10, a data driver 12, and a scan driver 14. The display panel 10 includes a plurality of pixel units and only one pixel unit 10a is depicted in order to simplify the diagram. The data driver 12 may comprise a plurality of data lines D1 to Dn, and the scan driver 14 may include a plurality of scan lines S1 to Sn. Each pixel unit 10a is connected to one data line and one scan line (e.g. the data line D3 and the scan line S3) so as to be arranged as a matrix.

Figure 2:
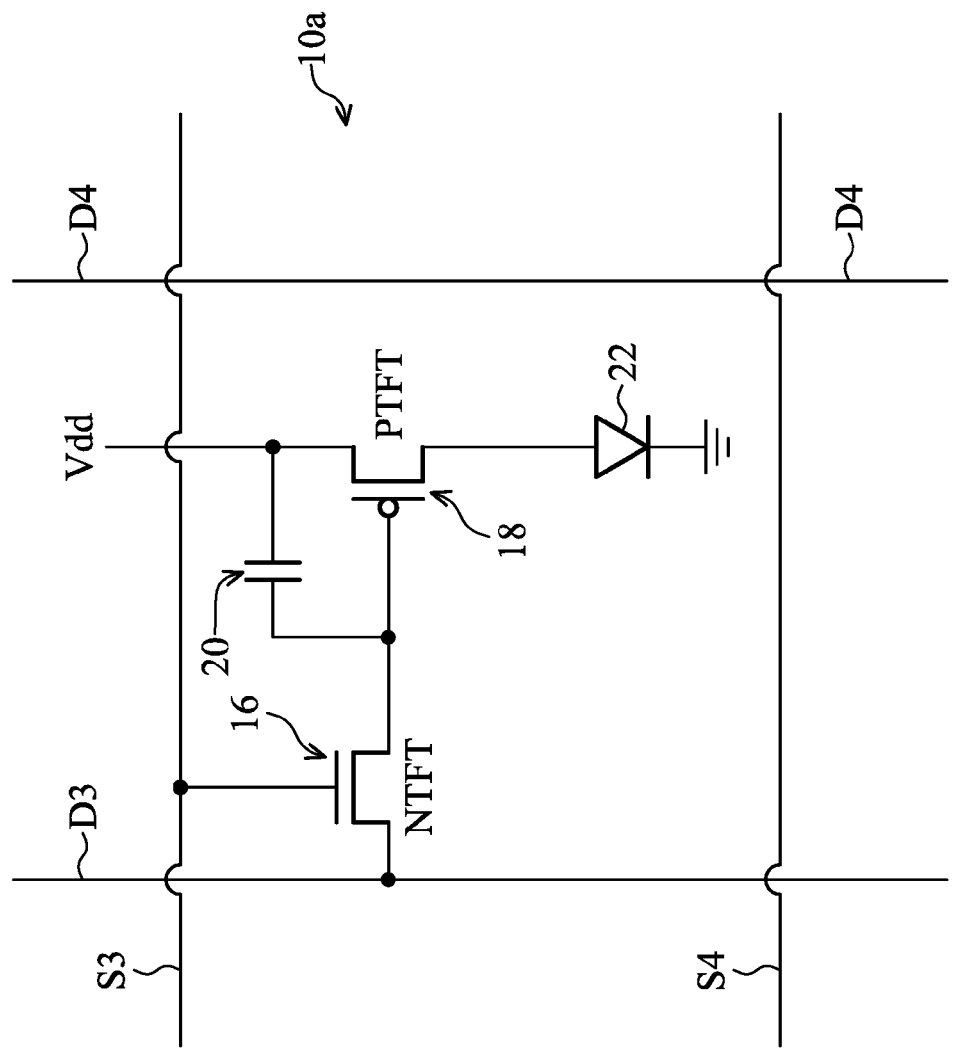
FIG. 2 is a circuit diagram of a pixel unit in FIG. 1.

Referring to FIG. 2, which illustrates a circuit diagram of a pixel unit 10a in FIG. 1. Typically, a pixel unit comprises a driving TFT for driving a light-emitting device, a switching TFT for changing the state of the pixel unit, and a storage capacitor for storing image data. In the embodiment, the pixel unit 10a comprises a light-emitting device 22 such as an organic light-emitting diode (OLED), and a driving TFT 18, which is typically a P-type TFT (PTFT) for driving the light-emitting device 22. The pixel unit 10a further comprises a switching TFT 16, which is typically an N-type TFT (NTFT), and a storage capacitor 20. The switching TFT 16 has a gate connected to the corresponding scan line S3, a drain connected to the corresponding data line D3, and a source connected between one terminal of the storage capacitor 20 and the gate of the driving TFT 18. Another terminal of the storage capacitor 20 is connected to the source of the driving TFT 18, which is connected to power source Vdd. The drain of the driving TFT 18 is connected to the light-emitting device 22.

As stated previously, electrical characteristics required for the driving TFT 18 is different from that for the switching TFT 16 and the TFTs used in the peripheral circuits. Accordingly, systems for displaying images and fabrication methods for the same are provided. Such systems comprise a TFT device for an AMOLED display, in which the TFT device can have TFTs with different electrical characteristics, thereby improving electrical characteristic of the driving TFT 18.

Figure 3A:
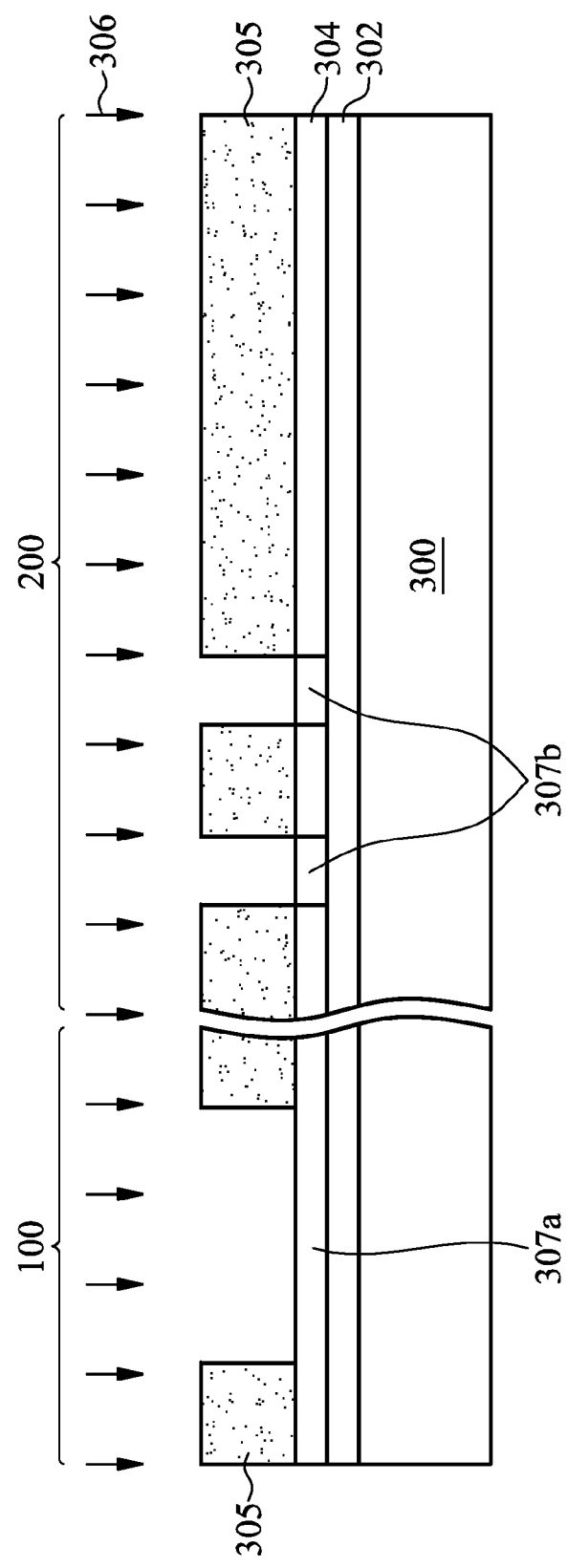
FIGS. 3A to 3H are cross sections of an embodiment of a method for fabricating a system for displaying images including a thin film transistor device according to the invention.
Figure 3B:
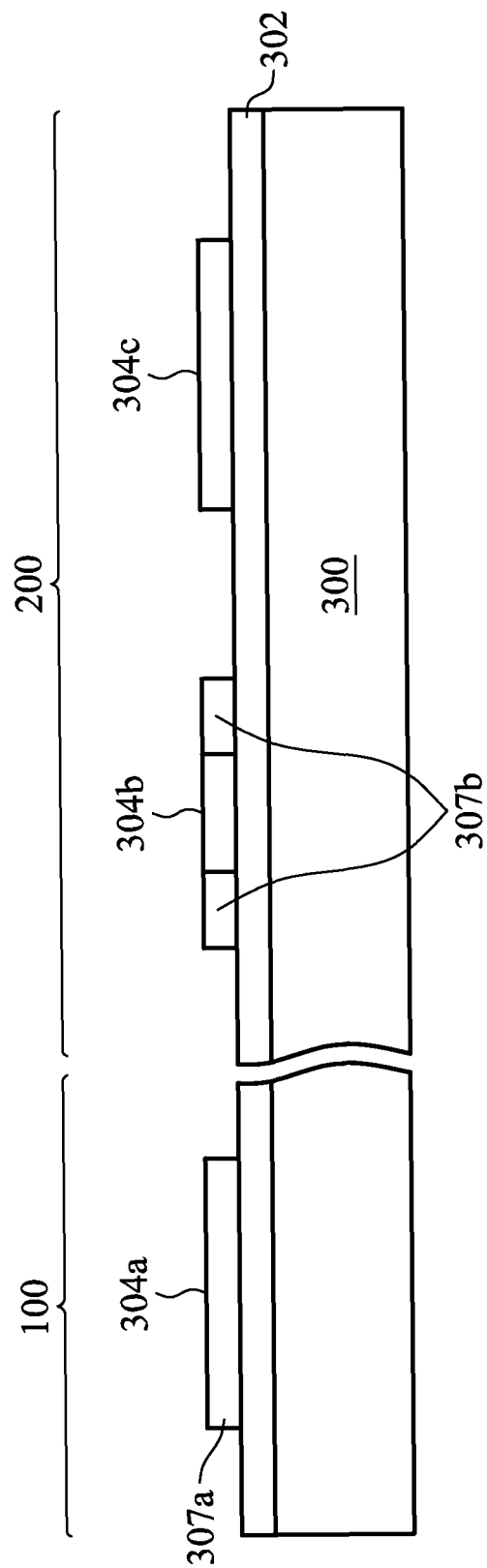
Figure 3C:
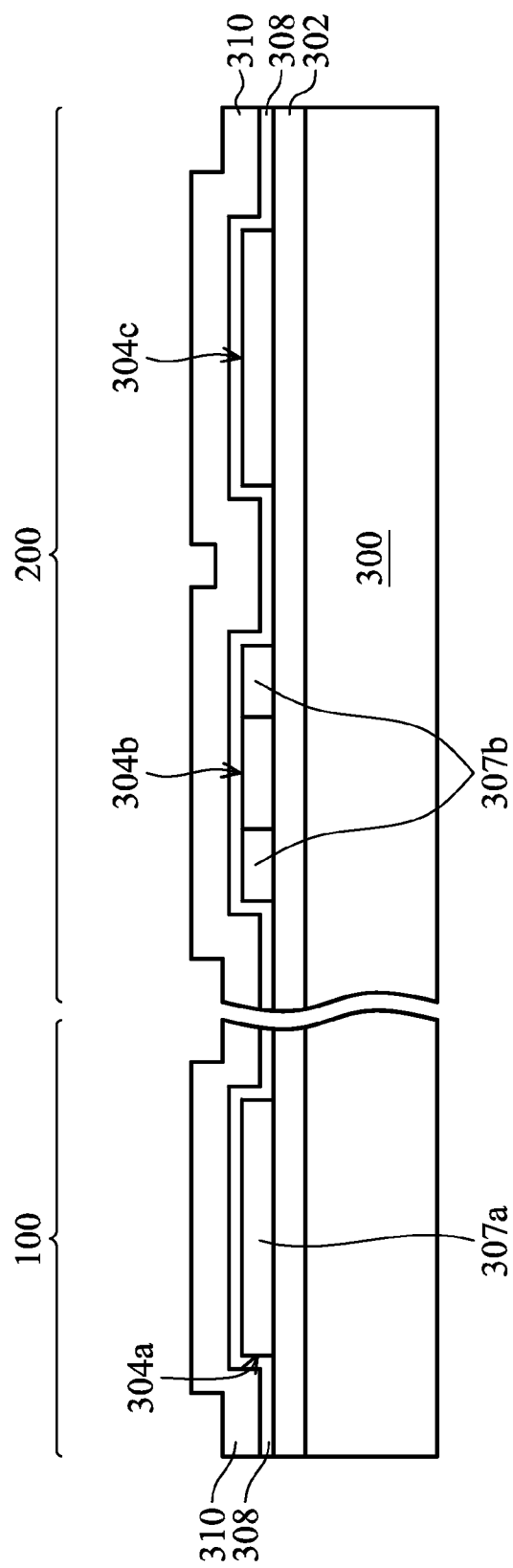
Figure 3D:
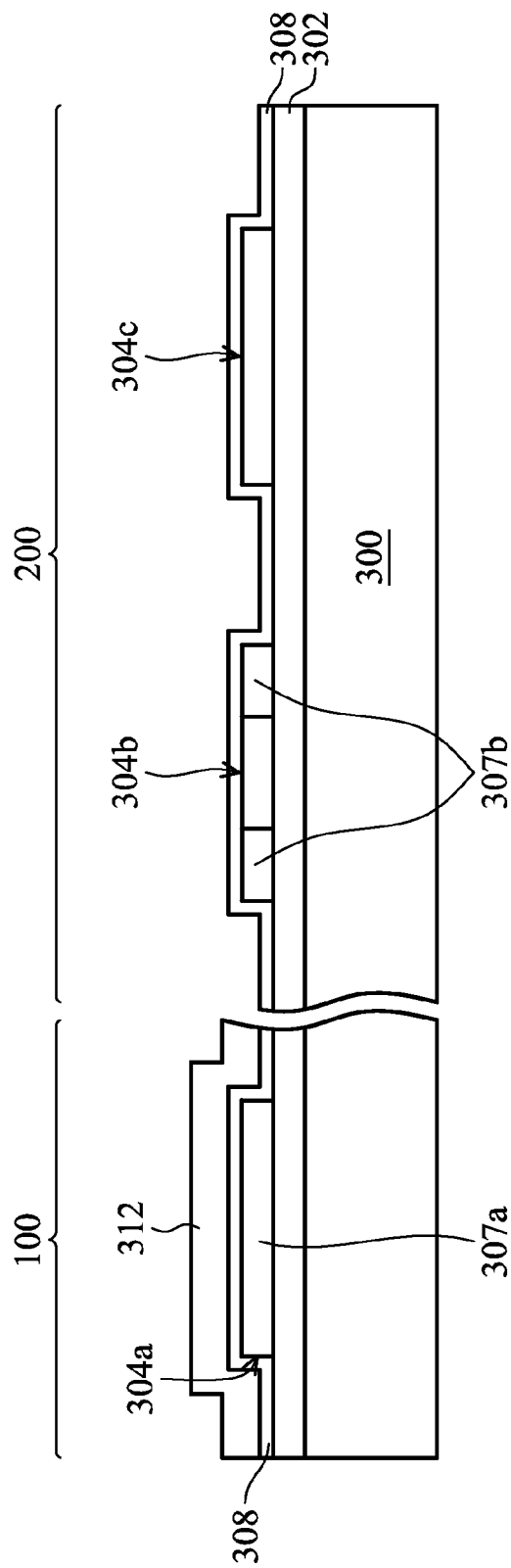
Figure 3E:
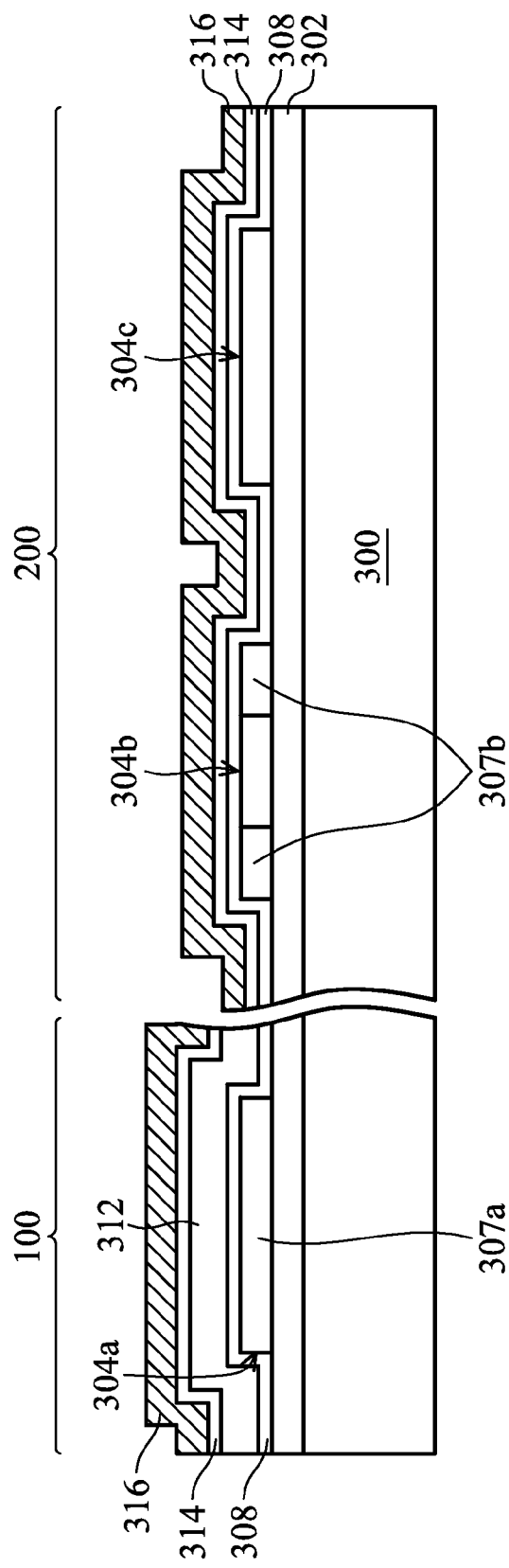
Figure 3F:
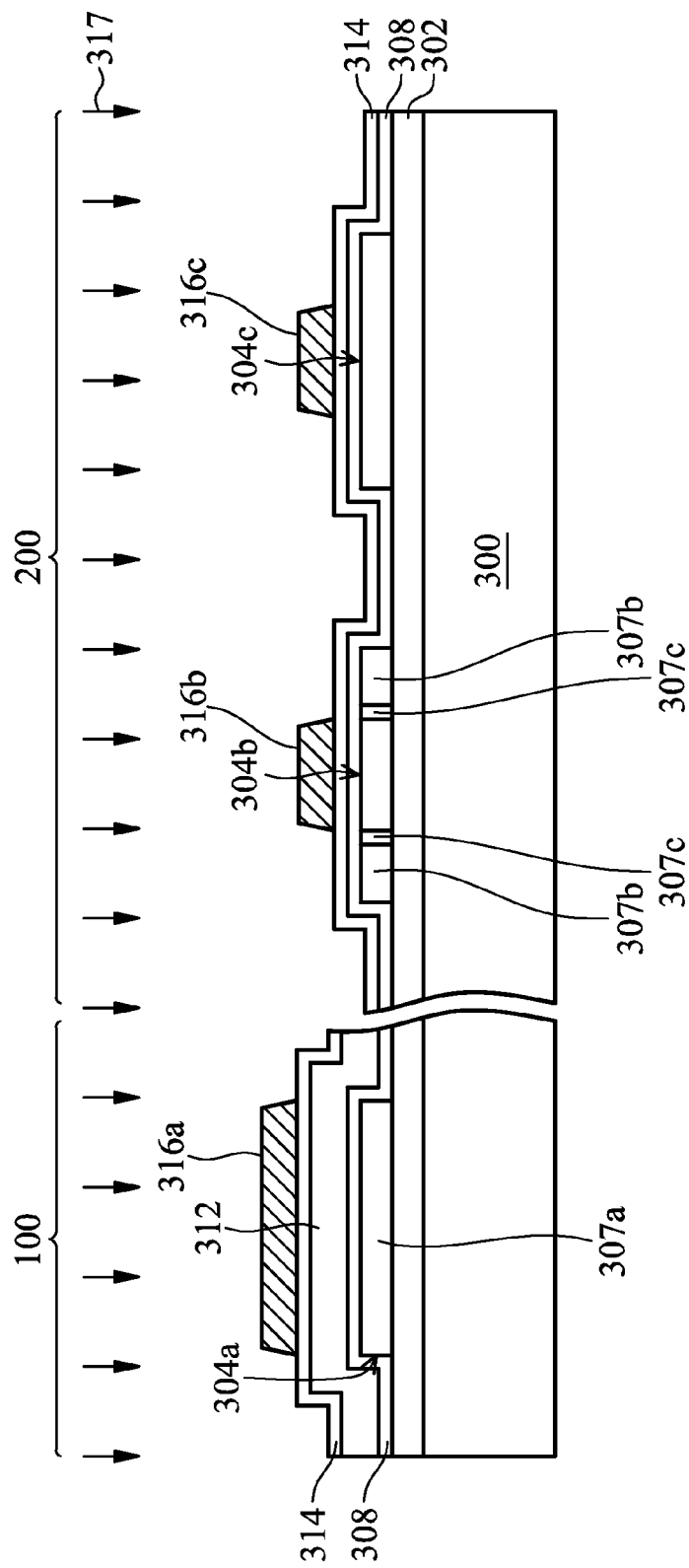
Figure 3G:
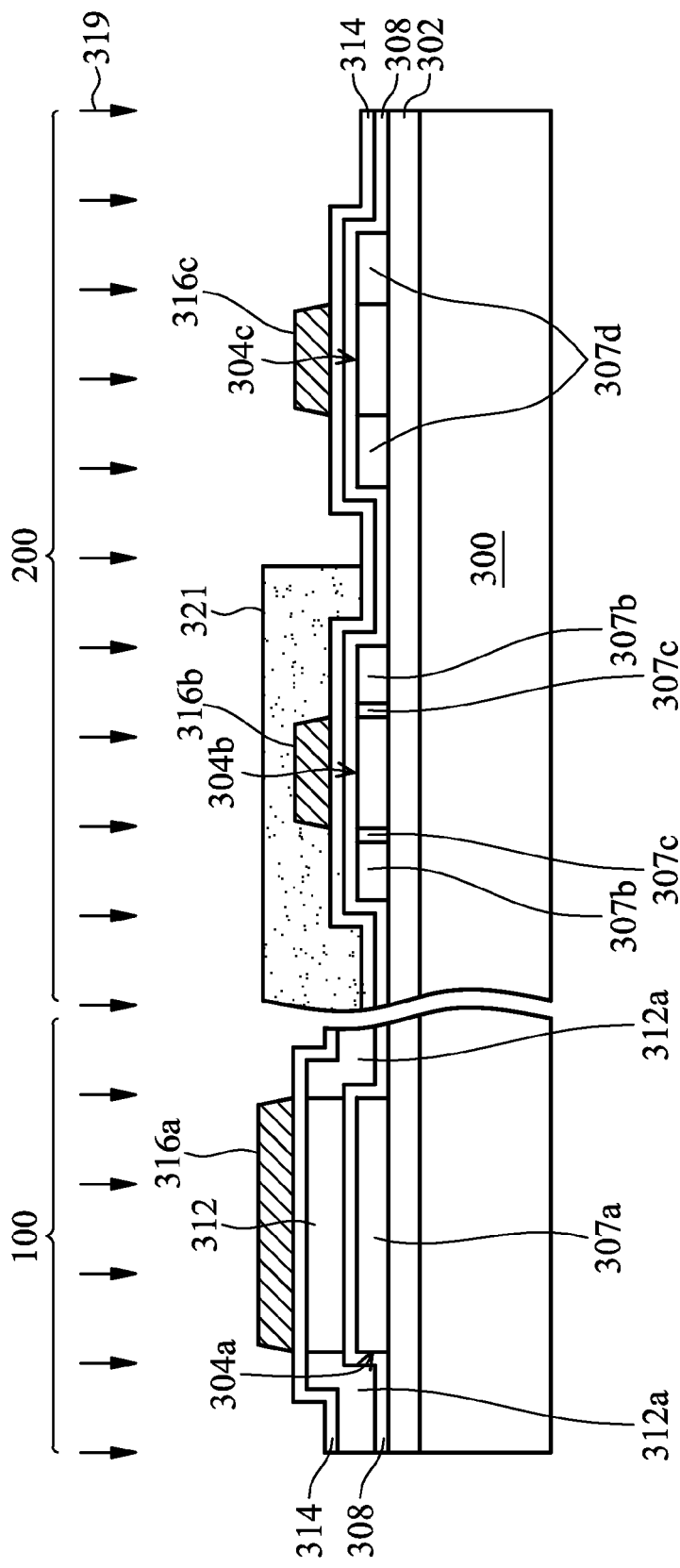
Figure 3H:
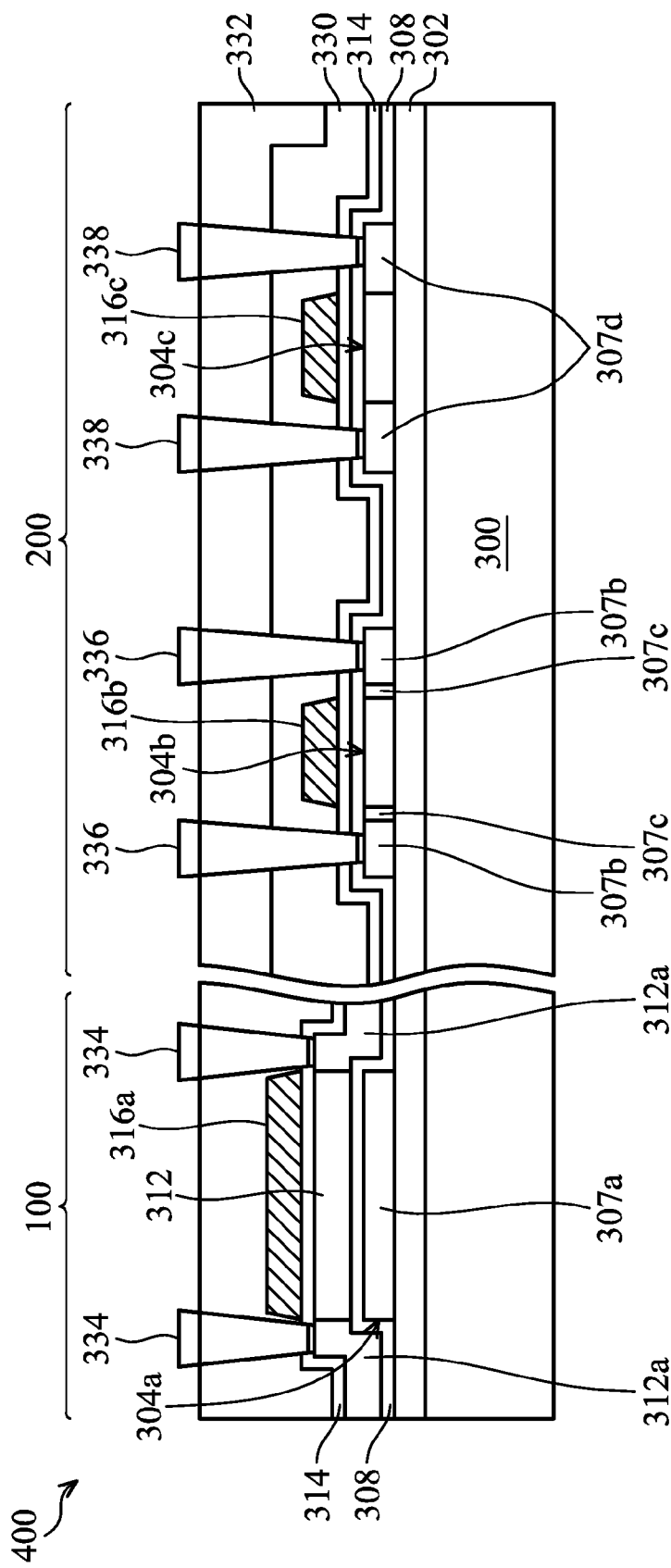
Figure 4A:
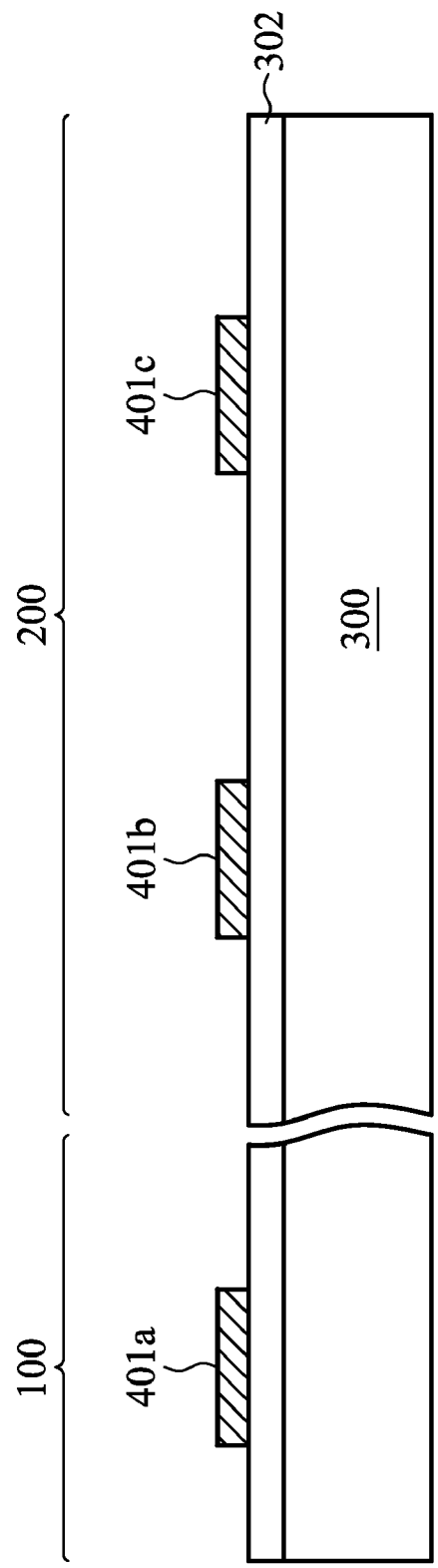
FIGS. 4A to 4J are cross sections of another embodiment of a method for fabricating a system for displaying images including a thin film transistor device according to the invention.
Figure 4B:
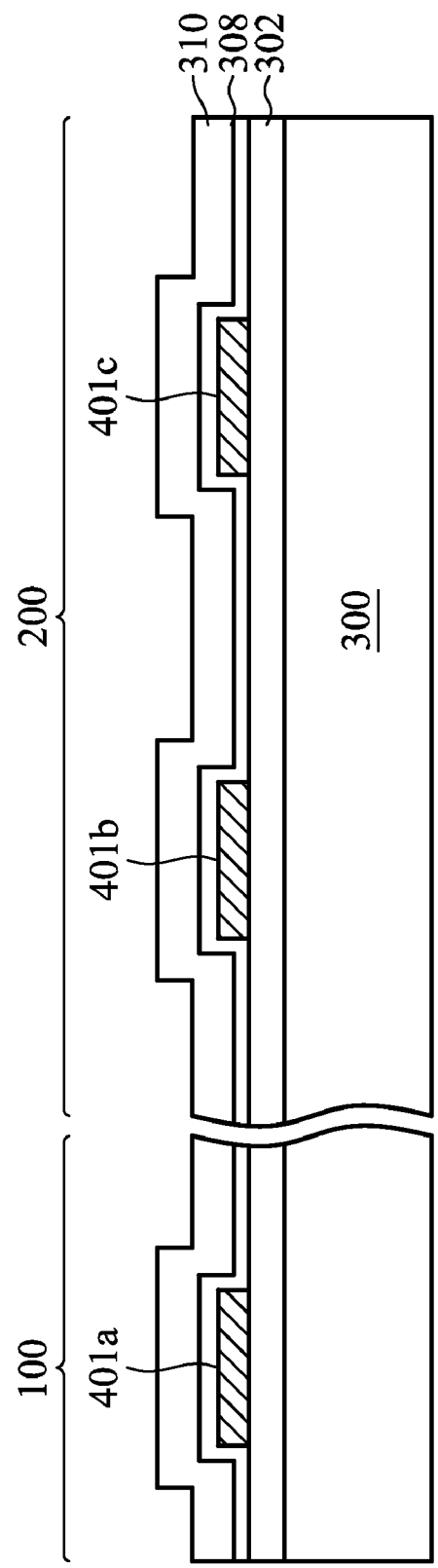
Figure 4C:
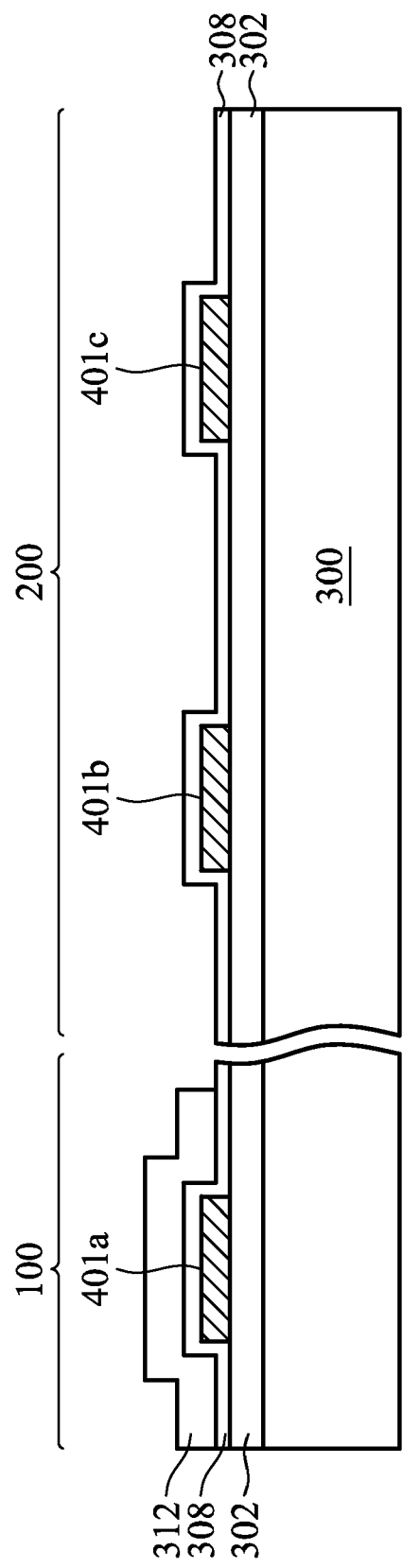
Figure 4D:
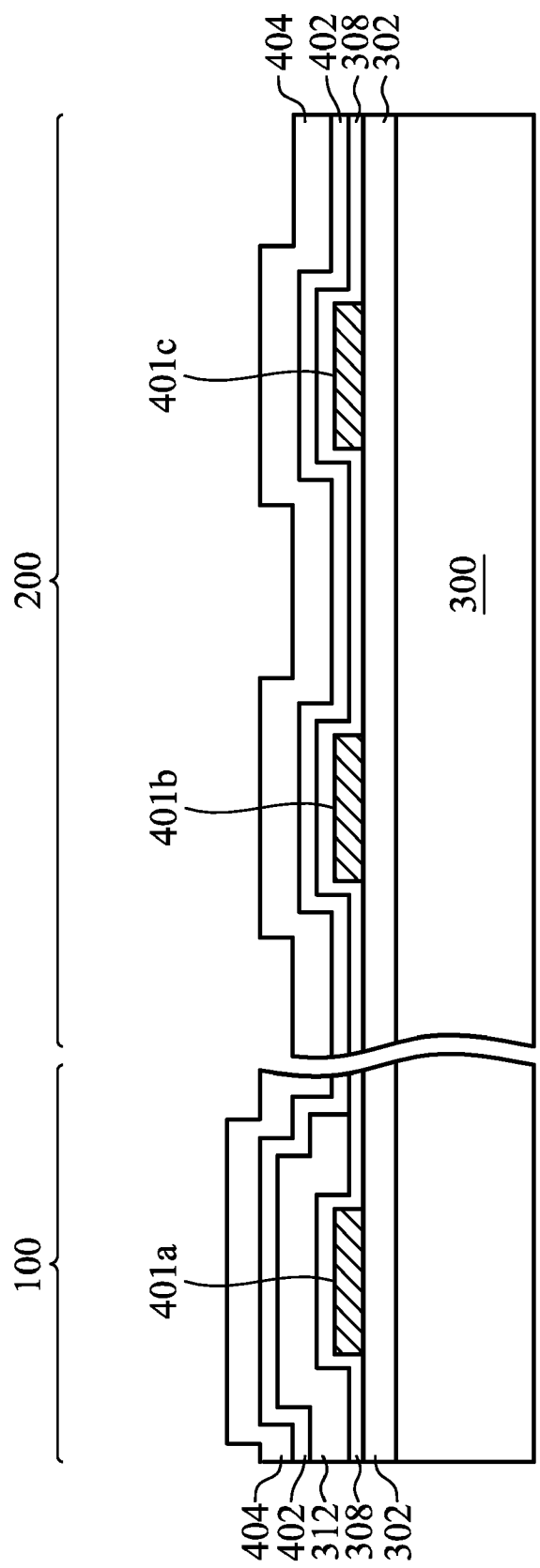
Figure 4E:
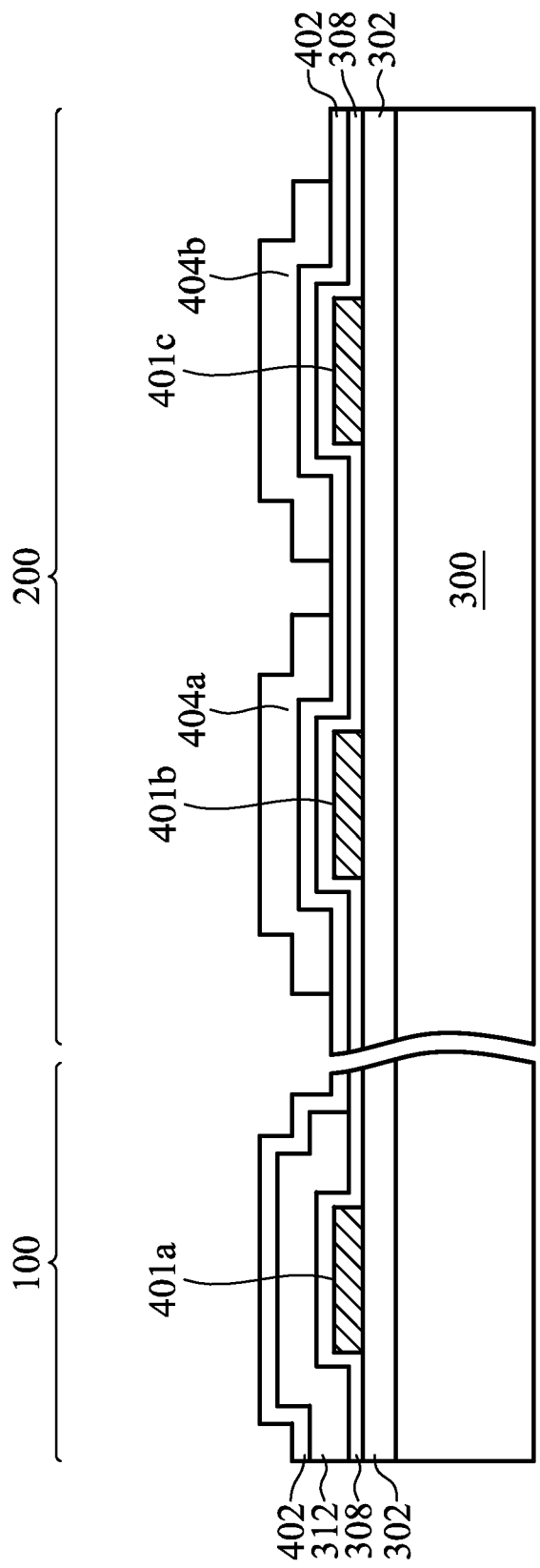
Figure 4F:
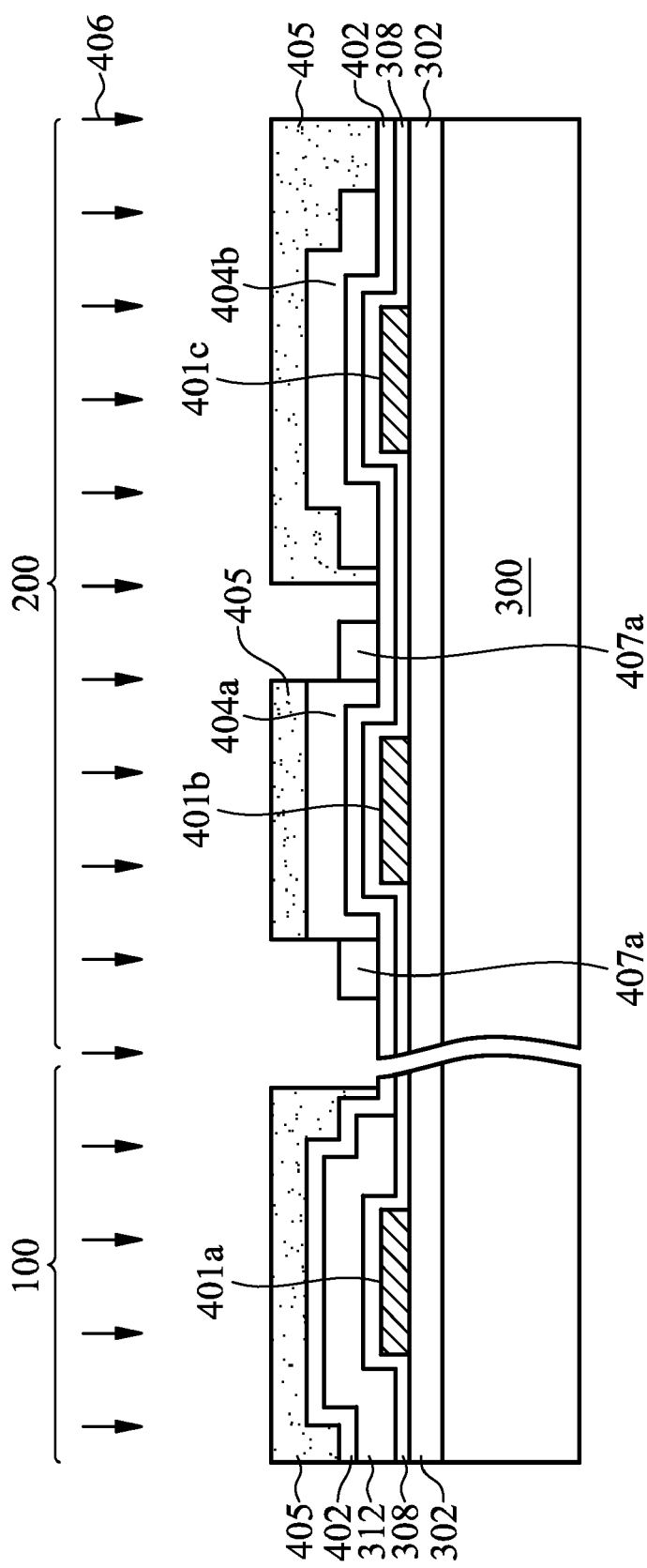
Figure 4G:
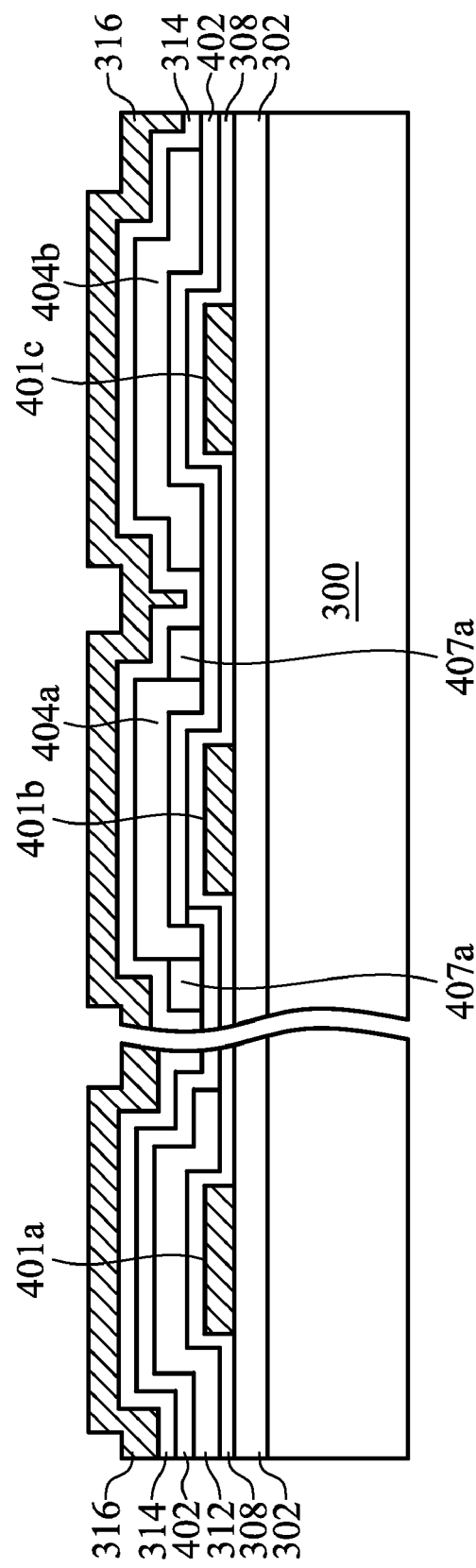
Figure 4H:
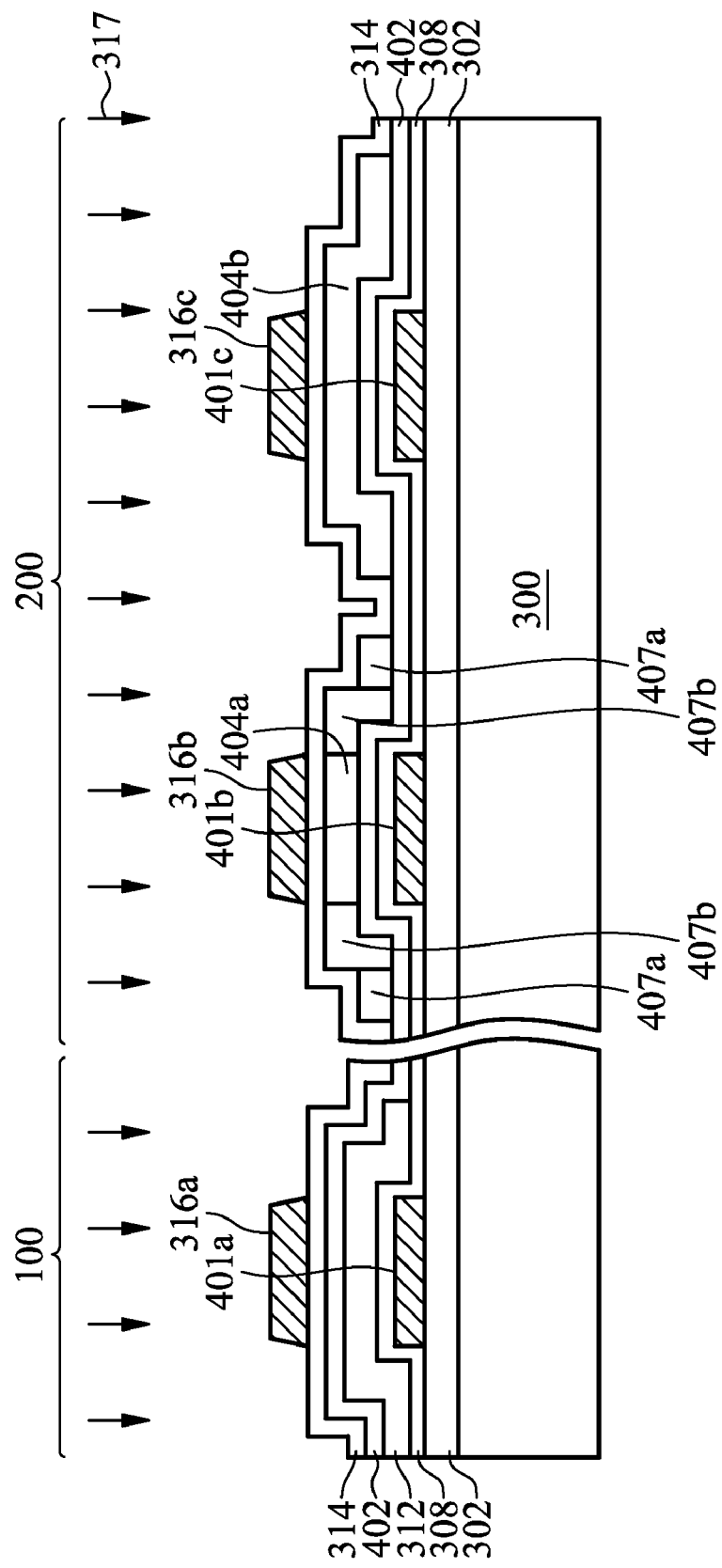
Figure 4I:
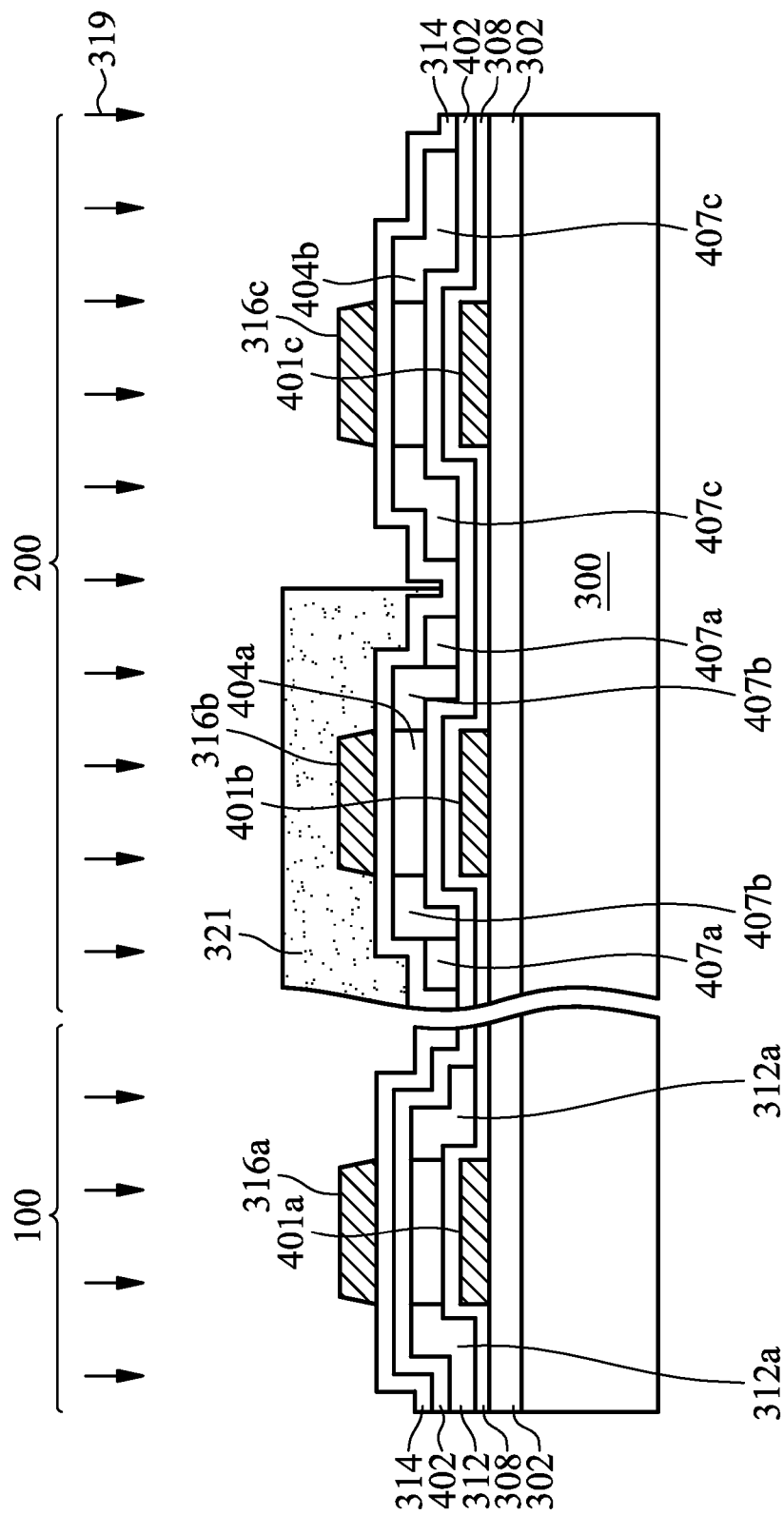
Figure 4J:
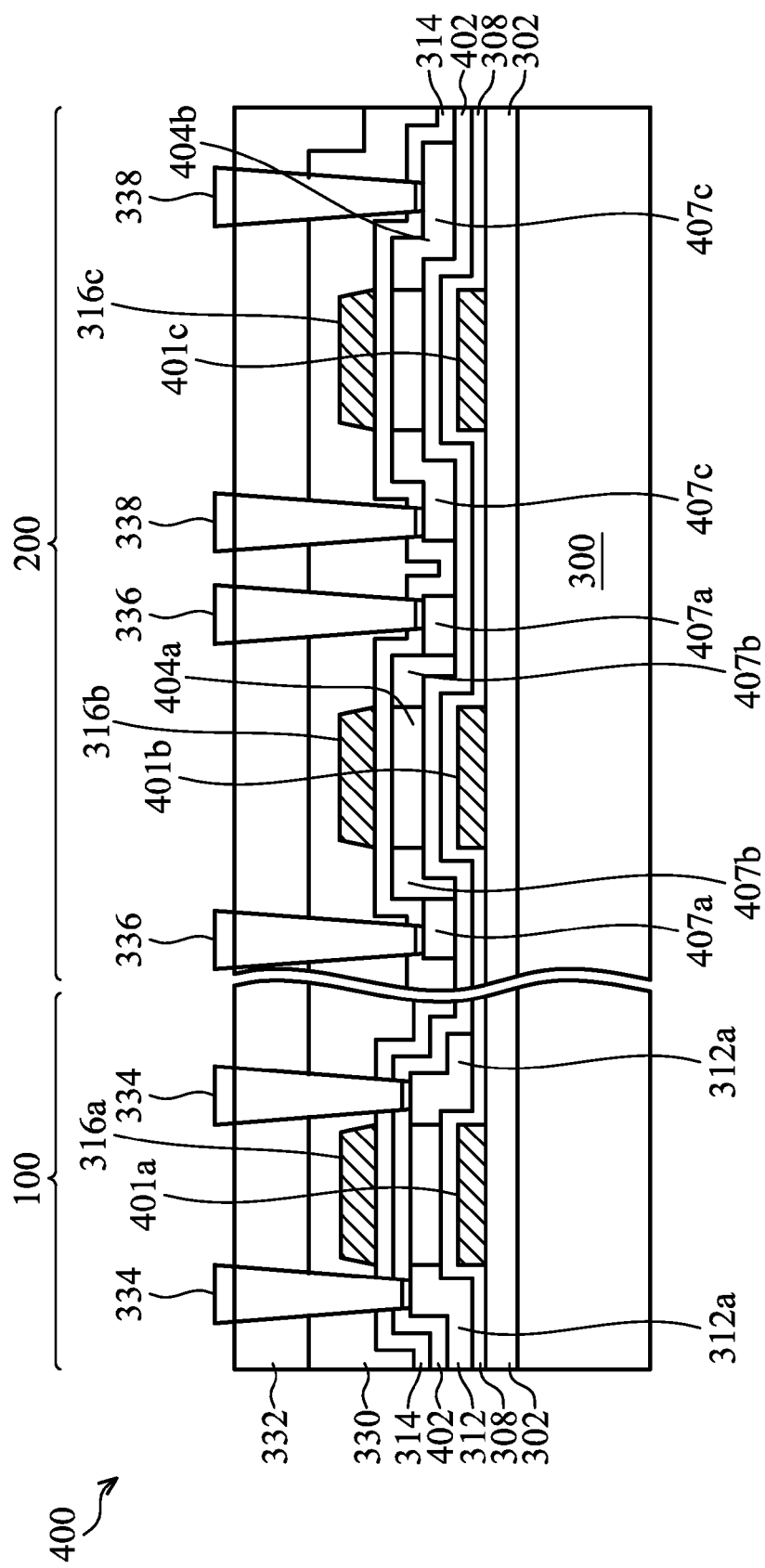

FIGS. 3H and 4J illustrate exemplary embodiments of such a system. Specifically, the system incorporates a thin film transistor (TFT) device 400. In the embodiment, one region of a glass substrate is utilized for fabrication of the NTFTs and the PTFTs in the peripheral circuits and the switching TFTs (e.g. NTFTs) in the pixel regions, and another region of the glass substrate is utilized for fabrication of the driving TFTs (e.g. PTFTs) in the pixel regions. Hereinafter, the TFTs in the peripheral circuits and the switching TFTs in the pixel regions are referred to as "non-driving TFTs".

Referring to FIG. 3H, the TFT device 400 comprises a substrate 300 having a first region 100 and a second region 200. A buffer layer 302, which may comprise silicon oxide, silicon nitride, or a combination thereof, may be optionally disposed on the substrate 300 to serve as an adhesion layer or a contamination barrier layer between the substrate 300 and the subsequent active layer.

A gate layer 304a, such as a polysilicon layer having a doped region 307a therein, is disposed on the buffer layer 302 in the first region 100, and polysilicon active layers 304b and 304c are disposed on the buffer layer 302 in the second region 200. In the embodiment, the gate layer 304a and the polysilicon active layers 304b and 304c are formed of the same polysilicon layer. In other words, the gate layer 304a and the polysilicon active layers 304b and 304c are formed by patterning a polysilicon layer.

An insulating layer 308 covers the substrate 300, the gate layer 304a, and the polysilicon active layers 304b and 304c to serve as a gate dielectric layer.

A polysilicon active layer 312 is disposed on the insulating layer 308 in the first region 100. In the embodiment, the polysilicon active layer 312 has a grain size different from that of the polysilicon active layers 304b and 304c. For example, the latter has a grain size greater than that of the former. The polysilicon active layer 312 comprises a channel region and a pair of source/drain regions 312a separated by the channel region. Also, the polysilicon active layer 304b comprises a channel region and a pair of source/drain regions 307b separated by the channel region, and the polysilicon active layer 304c comprises a channel region and a pair of source/drain regions 307d separated by the channel region.

An insulating layer 314 covers the polysilicon active layer 312 in the first region and covers the insulating layer 308 above the polysilicon active layers 304b and 304c in the second region 200 to serve as a gate dielectric layer. Gate layers 316a, 316b, and 316c are respectively disposed on the insulating layer 314 corresponding to the polysilicon active layers 312, 304b, and 304c. In the embodiment, gate layers 316a, 316b, and 316c may be formed of the same layer composed of metal or polysilicon.

In the embodiment, a thin film transistor is constructed by the polysilicon active layer 312, the insulating layers 308 and 314, and the gate layers 304a and 316a in the first region 100 and is utilized as a driving TFT for the light-emitting device of the AMOLED display. Moreover, two TFTs are constructed by the polysilicon active layers 304b and 304c, the insulating layers 308 and 314, and the gate layers 316b and 316c in the second region 200 and are utilized as non-driving TFTs (i.e. the switching TFT and the TFT in the peripheral circuits). It is noted that the actual number of the TFTs in the first and second regions 100 and 200 are based on a desired circuit design and is not limited to the exemplary three TFTs shown in FIG. 3H.

Referring to FIG. 4J, in the embodiment, there are gate layers 401b and 401c under the polysilicon active layers 404a and 404b in the second region 200, respectively, in addition to a gate layer 401a under the polysilicon active layer 312 in the first region 100. Namely, both TFTS in the first and second regions 100 and 200 have a dual-gate structure. Moreover, the gate layers 401a, 401b, and 401c may be formed of the same layer composed of metal or polysilicon. Unlike the embodiment of FIG. 3H, the insulating layer 308 extends from the first region 100 to the second region 200 and is under the polysilicon active layers 404a and 404b to cover the gate layers 401b and 401c. Moreover, an insulating layer 402 is disposed between the polysilicon active layer 312 and the insulating layer 314 in the first region 100 and extends between the insulating layer 308 and the polysilicon active layers 404a and 404b.

Referring to FIGS. 3A to 3H, which illustrate an embodiment of a method for fabricating a system for displaying images incorporating a thin film transistor device 400. In FIG. 3A, a substrate 300 having a first region 100 and a second region 200 is provided. In the embodiment, the first region 100 is used for fabrication of the driving TFT. The left side of the second region 200 is used for fabrication of the non-driving NTFT, and the right side of the second region 200 is used for fabrication of the non-driving PTFT. The substrate 300 may comprise glass, quartz, or other transparent materials.

Next, a buffer layer 302 may be optionally formed on the substrate 300 to serve as an adhesion layer or a contamination barrier layer between the substrate 300 and the subsequent layer. The buffer layer 302 may be a single layer or comprise multiple layers. For example, the buffer layer 302 may be formed of silicon oxide, silicon nitride, or a combination thereof. An amorphous silicon layer (not shown) is subsequently formed on the buffer layer 302 and then a crystallization process is performed to transfer the amorphous silicon layer into a polysilicon layer 304. In the embodiment, the polysilicon layer 304 is formed by a high power laser crystallization (i.e. standard laser crystallization) process, such as an excimer laser annealing (ELA) process. Next, a photoresist pattern layer 305 is formed on the polysilicon layer 304 and then a heavy ion implantation process 306 is performed on the polysilicon layer 304 using the photoresist pattern layer 305 as an implant mask to form, for example, N-type doped regions 307a and 307b in the polysilicon layer 304 in the first and second regions 100 and 200.

In FIG. 3B, the polysilicon layer 304 is patterned to form a gate layer 304a including the doped region 307a in the first region 100 and two polysilicon active layers 304b and 304c in the second region 200, in which the polysilicon active layer 304b includes the N-type doped region 307b serving as a source/drain region.

In FIG. 3C, an insulating layer 308 is formed on the first and second regions 100 and 200 of the substrate 300 and covers the gate layer 304a and the polysilicon active layers 304b and 304c. The insulating layer 308 may comprise silicon oxide, silicon nitride, or other gate dielectric materials well known in the art. Next, an amorphous silicon layer (not shown) is subsequently formed on the insulating layer 308 and then a crystallization process is performed to transfer the amorphous silicon layer into a polysilicon layer 310. Specifically, unlike the polysilicon layer 304, the polysilicon layer 310 is formed by a non-laser crystallization process using the insulating layer 308 as an isolating layer. For example, the non-laser crystallization process may comprise a solid phase crystallization (SPC), metal induced crystallization (MIC), metal induced lateral crystallization (MILC), field enhanced metal induced lateral crystallization (FE-MILC), or field enhanced rapid thermal annealing process. It is noted that the various crystallization processes mentioned above are exemplary embodiments and the invention is not limited thereto.

In FIG. 3D, the polysilicon layer 310 is patterned to form a polysilicon active layer 312 on the insulating layer 308 in the first region 100 and corresponding to the gate layer 304a, and remove the polysilicon layer 310 in the second region 200. Since the polysilicon active layer 312 in the first region 100 is formed by a crystallization process different from that for formation of the polysilicon active layers 304b and 304c in the second region 200, the polysilicon active layer 312 has a grain size different from that of the polysilicon active layers 304b and 304c. For example, the grain size of the polysilicon active layers 304b and 304c formed by ELA is greater than that of the polysilicon active layer 312 formed by the non-laser crystallization process.

In FIG. 3E, an insulating layer 314 and a metal layer 316 are successively formed on the insulating layer 308 and covers the polysilicon active layer 312. The insulating layer 314 may also comprise silicon oxide, silicon nitride, or other gate dielectric materials well known in the art. Moreover, the metal layer 316 may comprise molybdenum (Mo), an alloy thereof, or other metal gate materials well known in the art.

In FIG. 3F, the metal layer 316 is patterned to form metal gate layers 316a, 316b, and 316c on the insulating layer 314 corresponding to the polysilicon active layers 312, 304b, and 304c. Next, a light ion implantation process 317 is performed on the polysilicon active layer 304b using the metal gate layer 316b as implant masks to form N-type lightly doped drain (LDD) regions 307c in the polysilicon active layer 304b, and simultaneously form lightly doped regions (not shown) in the polysilicon active layers 312 and 304c, respectively. Here, a non-drive NTFT is constructed by the polysilicon active layer 304b, the insulating layers 308 and 314 thereon, and the metal gate layer 316b in the second region 200. In the embodiment, such a non-drive NTFT may serve as a switching TFT.

In FIG. 3G, a photoresist pattern layer 321 is formed on the non-drive NTFT. Next, a heavy ion implantation process 319 is performed on the polysilicon active layers 312 and 304c using the photoresist pattern layer 321 and the gate layers 316a and 316c as implant masks to form P-type source/drain regions 312a and 307d in the polysilicon active layers 312 and 304c, respectively. Here, a drive PTFT is constructed by the polysilicon active layer 312, the insulating layers 308 and 314, and the gate layers 304a and 316a in the first region 100. Moreover, a non-drive PTFT is constructed by the polysilicon active layer 304c, the insulating layers 308 and 314, and the gate layer 316c in the second region 200. In the embodiment, such a non-drive PTFT may serve as a TFT used in the peripheral circuits.

In FIG. 3H, after removal of the photoresist pattern layer 321, insulating layers 330 and 332 are successively formed on the structure shown in FIG. 3G to serve as a protective, planarization, or intervening layer or a combination thereof. The insulating layers 330 and 332 may comprise silicon oxide, silicon nitride, or a combination thereof. Thereafter, contact holes are formed in the insulating layers 330 and 332 by conventional lithography and etching processes to expose the source/drain regions 312a, 307b, and 307d. The contact holes are filled with a conductive material, such as aluminum (Al), molybdenum (Mo), titanium (Ti) or a combination thereof, to form electrodes 334, 336, and 338 corresponding to the source/drain regions 312a, 307b, and 307d. As a result, the TFT device 400 of the embodiment is completed.

Referring to FIGS. 4A to 4J, which illustrate another embodiment of a method for fabricating a system for displaying images incorporating a thin film transistor device 400. Elements in FIGS. 4A to 4J that are the same as those in FIGS. 3A to 3H are labeled with the same reference numbers as in FIGS. 3A to 3H and are not described again for brevity. In FIG. 4A, a conductive layer (not shown), such as a polysilicon or metal layer, is formed on the buffer layer 302. Thereafter, the conductive layer is patterned to form a gate layer 401a in the first region 100 and form gate layers 401b and 401c in the second regions 200.

In FIG. 4B, an insulating layer 308 and an amorphous silicon layer (not shown) are successively formed on the buffer layer 302 to cover the gate layers 401a, 401b, and 401c. Next, a crystallization process is performed to transfer the amorphous silicon layer into a polysilicon layer 310. In the embodiment, the polysilicon layer 310 is formed by a non-laser crystallization process. For example, the laser crystallization process may comprise SPC, MIC, MILC, FE-MILC, or field enhanced rapid thermal annealing process. It is noted that the various crystallization processes mentioned above are exemplary embodiments and the invention is not limited thereto.

In FIG. 4C, the polysilicon layer 310 is patterned to form a polysilicon active layer 312 on the insulating layer 308 in the first region 100 and corresponding to the gate layer 401a, and to remove the polysilicon layer 310 in the second region 200.

In FIG. 4D, an insulating layer 402 and an amorphous silicon layer (not shown) are successively formed on the insulating layer 308 and cover the polysilicon active layer 312 in the first region 100. Next, a crystallization process is performed to transfer the amorphous silicon layer into a polysilicon layer 404. Specifically, unlike the polysilicon layer 310, the polysilicon layer 404 is formed by a high power laser crystallization process, such as an excimer laser annealing (ELA) process, using the insulating layer 402 as an isolating layer (spacer). Accordingly, the grain size of the polysilicon active layer 312 is less than that of the polysilicon layer 404.

In FIG. 4E, the polysilicon layer 404 is patterned to remove the polysilicon layer 404 in the first region 100 and to form polysilicon active layers 404a and 404b in the second region 200 and corresponding to the gate layers 410b and 410c.

In FIG. 4F, a photoresist pattern layer 405 is formed on the structure shown in FIG. 4E to entirely cover the polysilicon active layers 312 and 404b in the first and second regions 100 and 200 and partially cover the polysilicon active layer 404a in the second region 200. A heavy ion implantation process 406 is performed on the uncovered polysilicon active layer 404a using the photoresist pattern layer 405 as an implant mask to form doped regions 407a, such as N-type doped regions, in the polysilicon active layer 404a for serving as source/drain regions.

In FIG. 4G, after removal of the photoresist pattern layer 405, an insulating layer 314 and a metal layer 316 are successively formed on the insulating layer 402 and cover the polysilicon active layers 404a and 404b in the second region 200. The insulating layer 314 may also comprise silicon oxide, silicon nitride, or other gate dielectric materials well known in the art. Moreover, the metal layer 316 may comprise molybdenum (Mo), an alloy thereof, or other metal gate materials well known in the art.

In FIG. 4H, the metal layer 316 is patterned to form metal gate layers 316a, 316b, and 316c on the insulating layer 314 corresponding to the polysilicon active layers 312, 404a, and 404b. Next, a light ion implantation process 317 is performed on the polysilicon active layer 404a using the metal gate layer 316b as implant masks to form N-type lightly doped drain (LDD) regions 407b in the polysilicon active layer 404a, and simultaneously form lightly doped regions (not shown) in the polysilicon active layers 312 and 404b, respectively. Here, a non-drive NTFT, such as a switching TFT, is constructed by the polysilicon active layer 404a, the insulating layers 308, 402, and 314, and the gate layers 401b and 316b in the second region 200.

In FIG. 4I, a photoresist pattern layer 321 is formed on the non-drive NTFT. Next, a heavy ion implantation process 319 is performed on the polysilicon active layers 312 and 404b using the photoresist pattern layer 321 and the gate layers 316a and 316c as implant masks to form P-type source/drain regions 312a and 407c in the polysilicon active layers 312 and 404b, respectively. Here, a drive PTFT is constructed by the polysilicon active layer 312, the insulating layers 308, 402, and 314, and the gate layers 401a and 316a in the first region 100. Moreover, a non-drive PTFT, such as a TFT used in the peripheral circuits, is constructed by the polysilicon active layer 404b, the insulating layers 308, 402, and 314, and the gate layers 401c and 316c in the second region 200.

In FIG. 4J, after removal of the photoresist pattern layer 321, insulating layers 330 and 332 are successively formed on the structure shown in FIG. 4I. Thereafter, contact holes are formed in the insulating layers 330 and 332 and then the contact holes are filled with a conductive material to form electrodes 334, 336, and 338 corresponding to the source/drain regions 312a, 407a, and 407c. As a result, the TFT device 400 of the embodiment is completed.

According to the embodiments, since the active layer of the driving TFT is formed by a crystallization process different from that for formation of the active layers of the switching TFT and the TFT used in the peripheral circuits, the active layers formed by different crystallization processes can have different grain sizes, such that the electrical characteristic of the driving TFT can be different from that of the TFT used in the peripheral circuits and the switching TFT. Additionally, since the driving TFT, the TFT used in the peripheral circuits, and the switching TFT have a dual-gate structure, good control ability can be obtained, thereby further improving the electrical characteristic of the driving TFT.

Figure 5:
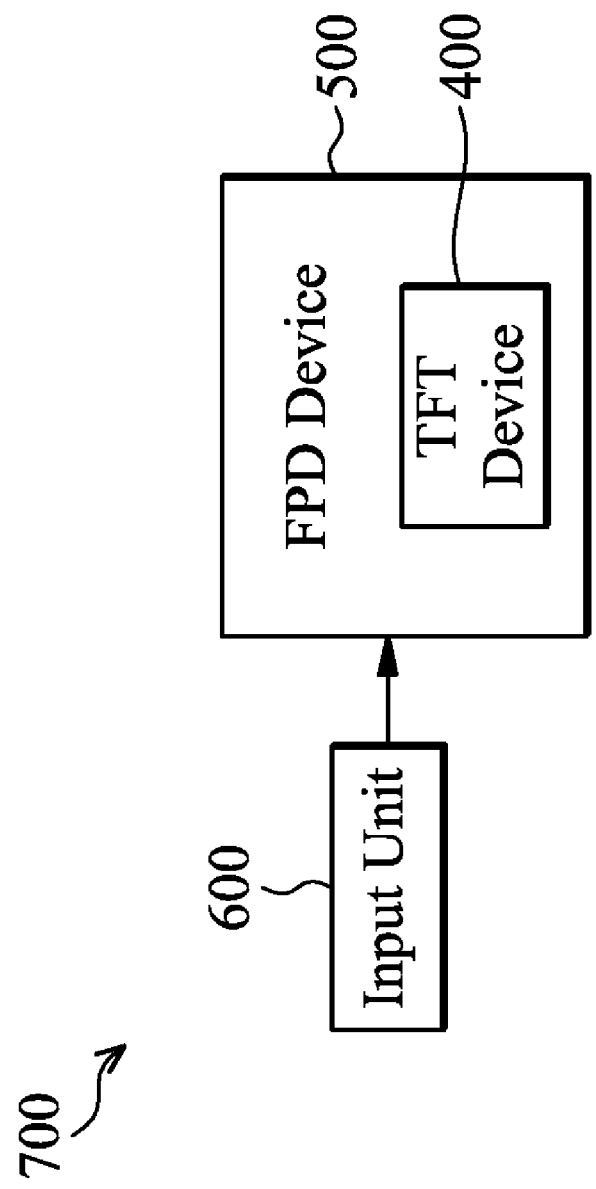
FIG. 5 schematically shows yet another embodiment of a system for displaying images.

FIG. 5 schematically shows yet another embodiment of a system for displaying images which, in this case, is implemented as a flat panel display (FPD) device 500 or an electronic device 700 such as a laptop computer, a mobile phone, a digital camera, a personal digital assistant (PDA), a desktop computer, a television, a car display or a portable DVD player. The described TFT device can be incorporated into the flat panel display device 500 that can be an OLED device. As shown in FIG. 5, the flat panel display device 500 comprises a TFT device, as the TFT device 400 shown in FIG. 3H or 4J. In some embodiments, the TFT device 400 can be incorporated into the electronic device 700. As shown in FIG. 5, the electronic device 700 comprises the FPD device 500 and an input unit 600. Moreover, the input unit 600 is coupled to the FPD device 500 and operative to provide input signals (e.g. image signals) to the FPD device 500 to generate images.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
a thin film transistor device, comprising:
a substrate having a first region and a second region;
a first gate layer disposed on the first region of the substrate;
a first insulating layer covering the first gate layer;
a first polysilicon active layer disposed on the first insulating layer;
a second polysilicon active layer disposed on the second region of the substrate;
a second insulating layer covering the first and second polysilicon active layers;
a second gate layer disposed on the second insulating layer above the first polysilicon active layer; and
a third gate layer disposed on the second insulating layer above the second polysilicon active layer,
wherein a first thin film transistor is constituted by the first polysilicon active layer, the first and second gate layers, and the first and second insulating layers in the first region, and a second thin film transistor is constituted by the second polysilicon active layer, the third gate layer, and the first and second insulating layers in the second region.

2. The system of claim 1, wherein the second polysilicon active layer has a grain size greater than that of the first polysilicon active layer.

3. The system of claim 1, wherein the first gate layer and the second polysilicon active layer are formed of the same polysilicon layer.

4. The system of claim 3, wherein the first insulating layer extends to the second region and covers the second polysilicon active layer.

5. The system of claim 1, wherein the first insulating layer extends to the second region and is under the second polysilicon active layer.

6. The system of claim 5, further comprising a fourth gate layer disposed in the second region and between the substrate and the first insulating layer under the second polysilicon active layer.

7. The system of claim 5, further comprising a third insulating layer disposed between the first polysilicon active layer and the second insulating layer in the first region and between the first insulating layer and the second polysilicon active layer in the second region.

8. The system of claim 1, wherein the second and third gate layers are formed of the same polysilicon layer.

9. The system of claim 1, wherein the second and third gate layers are formed of the same metal layer.

10. The system as claimed in claim 1, further comprising:
a flat panel display device comprising the thin film transistor device; and
an input unit coupled to the flat panel display device and operative to provide input signals to the flat panel display device, such that the flat panel display device displays images.

11. The system of claim 10, wherein the flat panel display device is an organic light-emitting diode display, the first thin film transistor is used as a driving transistor for a light-emitting device in a pixel region, and the second thin film transistor is used in a peripheral circuit or used as a switching transistor in the pixel region.

12. The system of claim 10, wherein the system comprises an electronic device comprising the flat panel display device, wherein the electronic device is a laptop computer, a mobile phone, a digital camera, a personal digital assistant, a desktop computer, a television, a car display or a portable DVD player.

13. A method for fabricating a system for displaying images, wherein the system comprises a thin film transistor device, comprising:
providing a substrate having a first region and a second region;
forming a first gate layer on the first region of the substrate;
covering the first gate layer with a first insulating layer;
forming a first polysilicon active layer on the first insulating layer by a first crystallization process;
forming a second polysilicon active layer on the second region of the substrate by a second crystallization process, such that the second polysilicon active layer has a grain size greater than that of the first polysilicon active layer;
covering the first and second polysilicon active layers with a second insulating layer; and
forming a second gate layer on the second insulating layer above the first polysilicon active layer and simultaneously forming a third gate layer on the second insulating layer above the second polysilicon active layer.

14. The method of claim 13, wherein the first gate layer and the second polysilicon active layer are formed of the same polysilicon layer.

15. The method of claim 14, further comprising extending the first insulating layer to the second region to cover the second polysilicon active layer.

16. The method of claim 13, wherein the formation of the first gate layer further comprises simultaneously forming a fourth gate layer on the second region of the substrate, wherein the first and fourth gate layers are formed of the same metal layer.

17. The method of claim 16, further comprising extending the first insulating layer to the second region to cover the fourth gate layer.

18. The method of claim 16, further comprising forming a third insulating layer above the first polysilicon active layer and under the second polysilicon active layer.

19. The method of claim 13, wherein the second and third gate layers are formed of polysilicon or metal.

20. The method of claim 13, wherein the first crystallization process comprises a solid phase crystallization, metal induced crystallization, metal induced lateral crystallization, field enhanced metal induced lateral crystallization, or field enhanced rapid thermal annealing process, and the second crystallization process comprises excimer laser annealing.

* * * * *